(12) United States Patent
Ohsawa et al.

(10) Patent No.: US 7,525,764 B2
(45) Date of Patent: Apr. 28, 2009

(54) SUSPENSION BOARD WITH CIRCUIT

(75) Inventors: Tetsuya Ohsawa, Ibaraki (JP); Yasuhito Funada, Ibaraki (JP); Hitoki Kanagawa, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 391 days.

(21) Appl. No.: 11/256,800

(22) Filed: Oct. 24, 2005

(65) Prior Publication Data
US 2006/0087769 A1   Apr. 27, 2006

(30) Foreign Application Priority Data
Oct. 25, 2004   (JP) .............................. 2004-309774

(51) Int. Cl.
*G11B 5/60* (2006.01)
*G11B 21/21* (2006.01)

(52) U.S. Cl. ................... 360/234.5; 360/245.9

(58) Field of Classification Search ............. 360/234.5, 360/245.9; 174/250, 260, 268
See application file for complete search history.

(56) References Cited

U.S. PATENT DOCUMENTS

| | | | |
|---|---|---|---|
| 6,318,624 B1 | 11/2001 | Pattanaik et al. | |
| 6,700,748 B1 | 3/2004 | Cowles et al. | |
| 2002/0060882 A1* | 5/2002 | Kidachi et al. | ........... 360/244.2 |
| 2003/0070834 A1* | 4/2003 | Tsuchiya et al. | ............ 174/250 |
| 2005/0028353 A1* | 2/2005 | Kidachi et al. | ........... 29/603.03 |
| 2005/0047009 A1* | 3/2005 | Tsuchiya et al. | ............. 360/122 |
| 2005/0063096 A1* | 3/2005 | Tsuchiya et al. | ......... 360/245.4 |
| 2005/0195529 A1 | 9/2005 | Tsuchida et al. | |

FOREIGN PATENT DOCUMENTS

| | | | |
|---|---|---|---|
| JP | 07-029657 A | | 1/1995 |
| JP | 2000-155922 A | | 6/2000 |
| JP | 2002-050018 A | | 2/2002 |
| JP | 2002-158411 A | | 5/2002 |
| JP | 2003-123217 A | | 4/2003 |
| JP | 2005-251262 A | | 9/2005 |

\* cited by examiner

*Primary Examiner*—William J Klimowicz
(74) *Attorney, Agent, or Firm*—Leydig, Voit & Mayer, Ltd.

(57) ABSTRACT

An area 5 for mounting a magnetic head is formed on a metal board 1, a conductive layer 4 is formed as a circuit pattern via an insulation layer 2 interposed outside this area and up to a metal board 1. A pattern end 4 to be a connection terminal for connection with the terminal of the magnetic head is formed on the circuit pattern, an end face 4a of the pattern end 4 is aligned with an end face 2a of the insulation layer 2 directly beneath it or protruded in the terminating direction from the end face 2a, thereby providing a structure preventing irradiation of a laser beam on the insulation layer 2.

18 Claims, 10 Drawing Sheets

(a)

(b)

(a)

(b)

(a)

(b)

(a)

(b)

(a)

(b)

(a)

(b)

(a)

(b)

SUSPENSION BOARD WITH CIRCUIT

FIELD OF THE INVENTION

The present invention relates to a suspension board with a circuit, which is used for a magnetic head of a hard disc drive.

BACKGROUND OF THE INVENTION

A hard disc drive, one of the magnetic storage devices in a computer, shows remarkable technical advances in achieving high-speed, high density, mass storage and the like. Its magnetic head for reading/writing is required to read/write on the surface of a magnetic disc rotating at a high speed, without a contact therewith but maintaining a small gap of a submicron order.

There can be mentioned a suspension board with a circuit, as a component for elastically pushing a magnetic head toward a magnetic disc surface rotating at a high speed, while resisting the airflow generated in the small gap, thereby to maintain a small gap between a surface of the magnetic disc and the magnetic head.

In a suspension board with a circuit, an elastic metal such as a stainless steel foil and the like is used as a material of the board, wherein one embodiment of the shape of the whole parts is, as shown in FIG. 1 of JP-A-10-12983, a kind of a band-like flat spring having a magnetic head mounting area and a circuit pattern.

A base end side of a suspension board with a circuit is fixed to an arm member extending from a device body of a hard disk driver and a magnetic head is mounted on a tip side (free end side), and the suspension board has a configuration wherein the board elastically supports the magnetic head on the tip side like a cantilever.

FIG. 8 is a schematic view of an enlarged tip part alone of a conventional suspension board with a circuit, and shows the configuration of the circuit and connections. A protective film covering the circuit, and so on have been omitted.

As shown in FIG. 8, the tip part of a metal board 100 has an area 130 to mount a magnetic head thereon, and a through-hole 140 is formed to surround therearound, whereby the area 130 is supported like a cantilever on the tip side alone at the center of the tip part of the metal board 100.

Furthermore, a conductive layer (circuit pattern shown with exta-thick line) 120 to transmit power, signal and the like is formed from the base side (not shown) of the board to the terminal of the magnetic head on the metal board, via an insulation layer 110. Said circuit pattern 120 has a pattern end 121 to be a connection terminal (or terminal pad, electrode pad) is formed to connect a terminal of the magnetic head.

While various bonding methods have been proposed to connect the terminal of a magnetic head and an end of a pattern, techniques to connect them using a solder has been adopted in recent years so that even if the attached magnetic head is defective, only the magnetic head can be replaced easily without discarding the whole assembly.

Particularly, as a method for dealing with small terminals of magnetic heads and narrow-pitched arrangement thereof, connecting methods using a solder ball can be mentioned. As shown in FIG. 9(a), this connecting method comprises first arranging a terminal H11 of a magnetic head H10 and a pattern end (terminal pad for connection) 121 of a circuit closely to each other forming a right angle, and supplying a solder ball 150 in contact with both terminal surfaces. Then, a laser beam is irradiated on the ball to melt it as shown in FIG. 9(b) with a reference number 151 to establish a connection.

JP-A-10-79105 and JP-A-2002-50018 describe in detail connection methods using a solder ball, a supply device (solder ball supply element) of a solder ball and the like.

However, the present inventors have examined in detail conventional connection methods using a solder ball and found that the positioning of laser beam irradiation and the positioning of solder ball need to be improved.

To be specific, according to the observation by the present inventors, when a magnetic head is made to be smaller and both connection terminals and a solder ball are made to be smaller, accurate irradiation of a laser beam solely on a solder ball (positioning of laser beam irradiation) becomes difficult, and as shown in FIG. 10, the vicinity of the outer circumference of a pattern end 120 and the like are often exposed to the beam. At the outer circumference of the pattern end 120, since, as shown in FIG. 10 by m, a lower insulation layer 110 extends from the pattern end, the extended part m is also exposed to the laser beam.

The insulation layer exposed to the laser beam is thermally decomposed and thermal decomposition products such as carbon and the like are produced. These thermal decomposition products adversely affect driving of the magnetic head, and may cause functional problems such as inhibition of electric signal and the like.

Furthermore, it has been found that, due to the dispersion in the positions of the solder balls 150 disposed on the pattern end 120, besides the problem of positioning of laser beam irradiation, the laser beam may be irradiated onto the insulation layer rather than the solder ball.

It is therefore an object of the present invention to solve the above-mentioned problems and provide a suspension board with a circuit, which has a structure wherein a laser beam is not easily irradiated on an insulation layer even if the beam is irradiated around a solder ball, and furthermore, dispersion in the placing positions of solder balls can be minimized.

SUMMARY OF THE INVENTION

The present invention is characterized by the following.

(1) A suspension board with a circuit, which comprises a metal board comprising an area for mounting a magnetic head, and other area comprising a conductive layer provided on the metal board as a circuit pattern via an insulation layer, the circuit pattern having a pattern end to be a terminal to be connected with the terminal of a magnetic head, and the end face of the pattern end is aligned with the end face of the insulation layer directly beneath, or protruding from the end face of the insulation layer in the terminating direction.

(2) The suspension board with a circuit of the above-mentioned (1), wherein the metal board has an opening penetrating the board on the terminating side of the pattern end, and an inner wall surface of the opening is aligned with the end face of the insulation layer.

(3) The suspension board with a circuit of the above-mentioned (1), wherein the metal board has an opening penetrating the board on the terminating side of the pattern end, and an inner wall surface of the opening is retracted to a position beneath the insulation layer.

(4) The suspension board with a circuit of the above-mentioned (3), wherein the pattern end protrudes in the terminating direction from the end face of an insulation layer directly beneath it, then bends toward the lower layer side, covering the end face of the insulation layer, and further bends in the terminating direction, whereby a stepped-part is made on the upper surface of the pattern end, with a lower level on the tip side.

(5) The suspension board with a circuit of the above-mentioned (4), wherein the insulation layer directly beneath the pattern end comprises at least two protrusion parts protruding from said end surface in the terminating direction, and by covering the protrusions, two ridge-shaped protrusion parts are also formed on the lower level surface on the tip side of the stepped-part of the pattern ends.

(6) The suspension board with a circuit of the above-mentioned (1), wherein the pattern end has an end face aligned with that of an insulation layer directly beneath it, and the insulation layer has a stepped-part made on the upper surface of the pattern end, with a lower level surface on the tip side, and by covering the stepped-part of the upper surface of the insulation layer, a stepped-part is also formed on the upper surface of the pattern end.

(7) The suspension board with a circuit of the above-mentioned (6), wherein, of the upper surfaces of the stepped-part of the insulation layer directly beneath the pattern end, at least two ridge-shaped protrusion parts are formed, on the lower level surface on the tip side, in the terminating direction from the stepped-part, and by covering the ridge-shaped protrusion parts, two ridge-shaped protrusion parts are also formed on the lower level surface on the tip side, out of the pattern end having the stepped-part.

(8) The suspension board with a circuit of the above-mentioned (6), wherein the material of the insulation layer is a photosensitive resin and the stepped-part and/or a ridge-shaped protrusion part of the upper surface of the insulation layer is formed by changing the amount of irradiation of light on the photosensitive resin.

(9) The suspension board with a circuit of the above-mentioned (1), wherein the metal board is a stainless flat spring having a thickness of 10-70 μm.

(10) The suspension board with a circuit of the above-mentioned (1), wherein the magnetic head is a magnetic head of a hard disc drive.

(11) The suspension board with a circuit of the above-mentioned (1), wherein the amount of protrusion of the end face of the pattern end relative to the end face of the insulation layer is 0 μm-100 μm.

(12) The suspension board with a circuit of the above-mentioned (1), wherein the solder to connect a terminal of a magnetic head to be mounted and a pattern end is supplied as a solder ball and two ridge-shaped protrusion parts are so formed to receive and keep the solder ball in a groove between them.

BRIEF DESCRIPTION OF THE DRAWINGS

FIG. 1(a) is a board surface of the suspension board with a circuit and FIG. 1(b) is an end view of a partially enlarged section A-A of FIG. 1(a).

FIG. 5(a) is a perspective view of the whole appearance near a pattern end, and FIG. 5(b) is a perspective view of the structure of the tip of the insulation layer, breaking away the tip of the pattern end for explanation.

FIG. 6(a) is a view seeing the pattern end from the side and FIG. 6(b) is section B-B of FIG. 6(a) with a solder ball drawn therein and a hatching applied only to the section.

FIG. 7(a) is a perspective view of the whole appearance near a pattern end, and FIG. 7(b) is a perspective view of the structure of the tip of the insulation layer, breaking away the tip of the pattern end for explanation.

FIG. 9(a) shows a solder ball placed therein and FIG. 9(b) shows terminals connected with each other by melting the solder ball.

FIG. 10 is a view showing the structure near the pattern end of a conventional suspension board with a circuit, and explains the problems the present inventors took note of.

Figure 1:
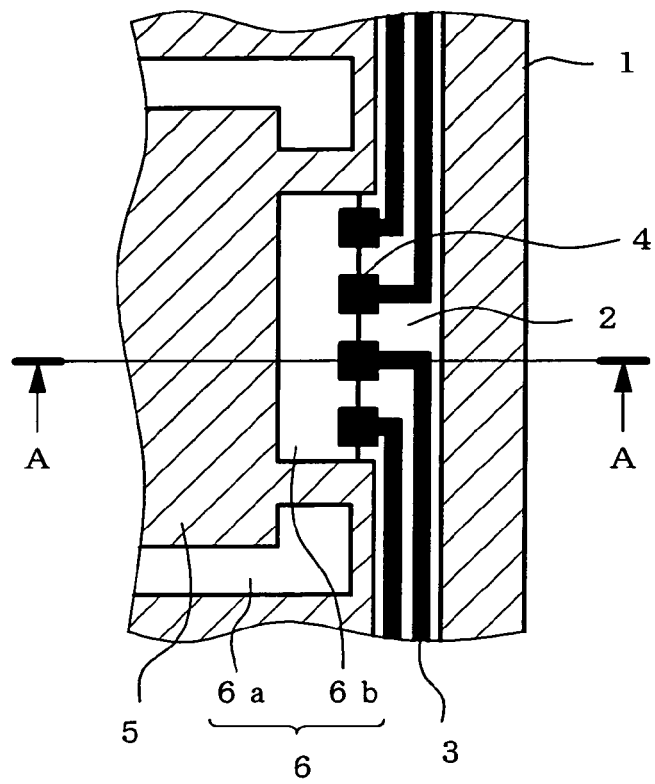
FIG. 1 is a schematic view of an enlarged tip of the suspension board with a circuit of the present invention, wherein a hatching is appropriately applied to distinguish the area.
Figure 1:
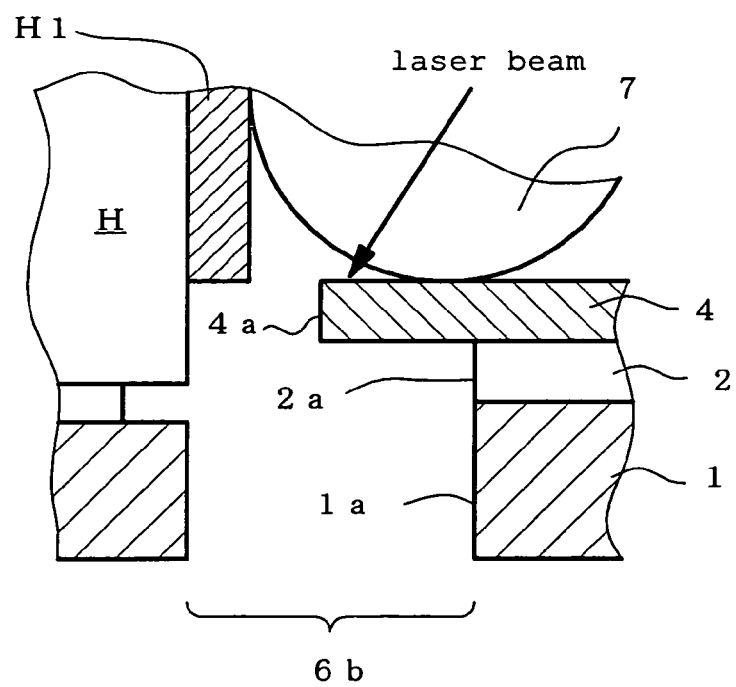

In the Figures, each symbol shows the following. 1; metal board, 2; insulating layer, 3; conductive layer, 4; pattern end, 5; area for mounting a magnetic head, 6; through-hole, 7; solder ball

DETAILED DESCRIPTION OF THE INVENTION

As shown in FIG. 1(b) as a partial view of section A-A in FIG. 1(a), the present invention employs a structure wherein an end face 4a of a pattern end 4 is protruded or overhung in the terminating direction from an end face 2a of an insulation layer 2 directly beneath the pattern end 4 (alternatively, a structure where both end faces 4a and 2a are aligned).

Figure 10:
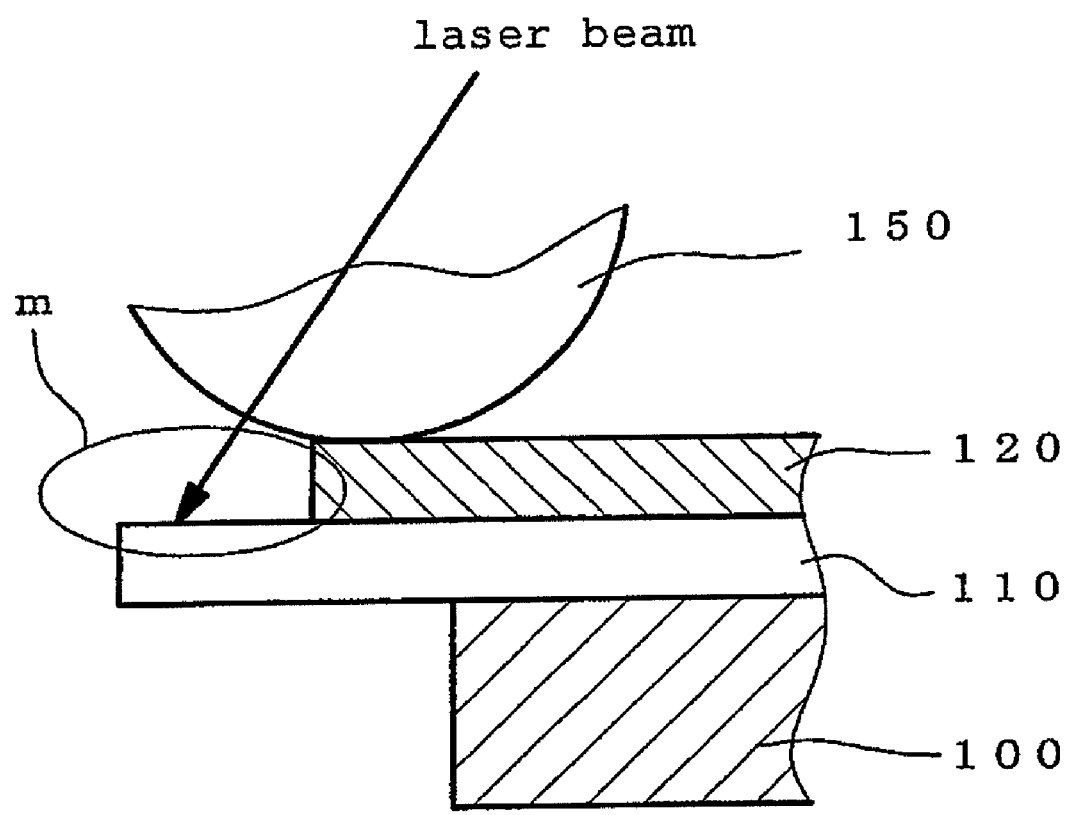

In contrast, when an insulation layer is simply formed on a metal board and a circuit pattern is then formed thereon according to a conventional manufacturing process without awareness of the above-mentioned problems noted in the present invention, an end face of an insulation layer 110 directly beneath an end face of a pattern end 120 always protrudes from the end face of the pattern end 120, as shown in FIG. 10. This is because an insulation layer 110 is formed to insulate the pattern end 120 from the metal board 100.

To remove a insulation layer 110 and a metal board 100 under a conductive layer 120 as in the structure shown in FIG. 1(b) of the present invention, a new removal step needs to be added.

According to the structure of the present invention, even if a laser beam is irradiated near the terminal portion of a pattern end 4, direct irradiation on the insulation layer is suppressed, and the development of a thermally decomposed product is suppressed.

In the present invention, a stepped-part, which comprises surfaces of different levels, is made on the insulation layer directly beneath the pattern end, and utilizing its effect, a stepped-part is also made in the level of the surface of the pattern end. Due to the stepped-part, a solder ball does not move but is always kept at a fixed position, and deviated laser beam irradiation is more preferably suppressed.

FIG. 1(a) and FIG. 1(b) show schematic views of an enlarged tip of the suspension board with a circuit of the present invention. The basic structure, action and the like of the suspension board with a circuit as a whole are approximately same as those explained for the background of the invention.

For example, the following aspects are to be referred to prior art: (a) an elastic metal is used as a material of a board 1, and as a whole, it is a kind of a flat spring band, (b) an area 5 for mounting a magnetic head H1 is provided on the metal board 1, and a through-hole 6 is formed to surround the area 5 except a part thereof, whereby the area 5 is supported like a cantilever on the tip side alone, (c) conductive layer (printed circuit pattern) 3 is provided via an insulation layer 2 on the outside of the area 5, whereby the base side and the tip side are communicated, (d) a pattern end 4 to be a connection terminal to connect to the terminal of a agnetic head is formed on a tip side of the circuit pattern 3, (e) a terminal of the magnetic head disposed and a pattern end 4 are arranged to form a 90° corner to allow connection by a solder ball and the like. In FIG. 1, a protective film further covering the conductive layer and the like are not shown.

The terminating direction of a pattern end is a direction heading from the root of the pattern end toward an end face. In the embodiment shown in FIG. 1(a), the terminating direction of a pattern end is reverse to the tip direction of the whole suspension board with a circuit.

Figure 3:
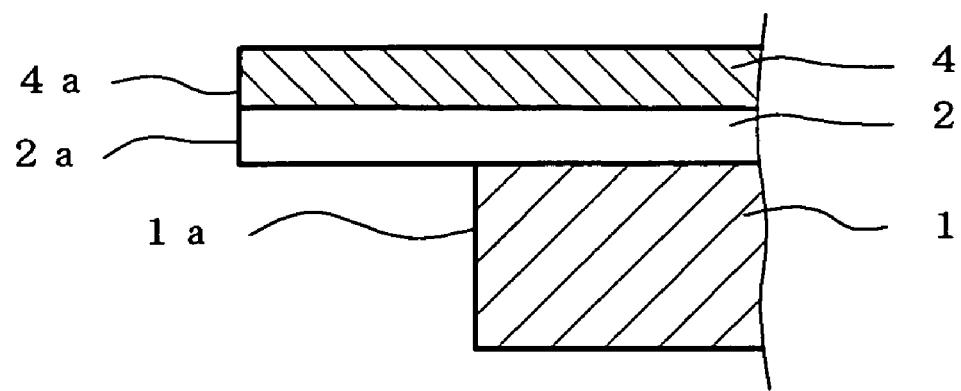
FIGS. 3(a)-(b) are views explaining the embodiment of FIG. 1.
Figure 3:
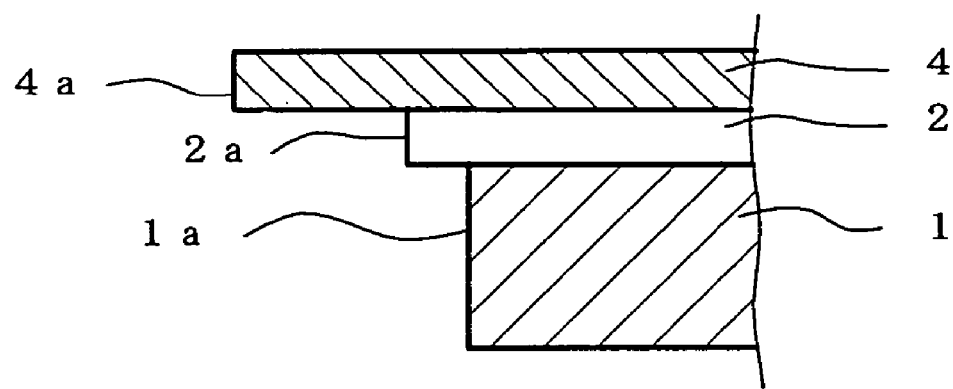

The basic structural characteristics of the suspension board with a circuit are that, as described in the above-mentioned effect of the invention, an end face 4a of a pattern end 4 is protruded in the terminating direction from an end face 2a of an insulation layer 2, as shown in FIG. 1, or aligned with an end face 2a of an insulation layer 2, as shown in FIG. 3(a).

By this constitution, even if the laser beam is deviated from the solder ball and irradiated on the surrounding surfaces, irradiation on the terminal portion of the insulation layer 2 is suppressed, as shown in FIG. 1(b).

The material (member) of the metal board may be any as long as it is a metal plate processed to have elasticity permitting function as a suspension board, and known ones can be used. For example, flat spring materials such as a stainless steel plate, a copper-beryllium plate, a phosphor bronze plate and the like can be mentioned. Particularly, a stainless steel plate is a preferable material from the aspects of rigidity, corrosion resistance and the like.

The thickness of a metal board can be appropriately determined according to the elasticity of a material or member and the resilience required of the whole board. For example, in the case of a stainless steel plate, a suitable thickness is preferably about 10-70 μm.

While the material of the insulation layer is not particularly limited, synthetic resins such as polyimide resin, polyamide-imide resin, acrylic resin, polyethernitrile resin, polyethersulfone resin, polyethylene terephthalate resin, polyethylene naphthalate resin, polyvinyl chloride resin and the like can be mentioned. Particularly, a photosensitive resin is preferable for forming a stepped-part in the insulation layer utilizing a technique of gradation exposure as mentioned below, and photosensitive polyimide is a preferable material because it is superior in the heat resistance and chemical resistance.

Conventionally known techniques can be applied as regards specific examples of photosensitive polyimide, production methods thereof, pattern formation techniques utilizing photosensitivity thereof and the like, and JP-A-10-12983 and JP-A-7-179604 provide detailed description thereof.

The material of the conductive layer may be any circuit pattern material used for conventionally known suspension boards with circuit and, for example, copper, nickel, gold, solder, alloys thereof and the like can be mentioned. Particularly, copper is a preferable material from the aspects of conductivity, cost and processability.

The conductive layer may have various multi-layer structures as necessary in addition to a single layer. For example, a material layer preferable for soldering may be formed as a surface layer on a pattern end etc., and the like.

While the amount of protrusion of the pattern end 4 from the end face 2a of the insulation layer 2 in the embodiment of FIG. 1 varies depending on the size of the suspension board with a circuit and layer thickness of the pattern end (conductive layer), it is preferably about 0 μm-100 μm, particularly preferably 10 μm-80 μm.

A through-hole 6 is formed around an area 5 for mounting a magnetic head H1. As shown in FIG. 1(a), (b), opening 6b for penetrating a metal board 1 is also formed on the tip side (the extremity side) of the pattern end. Formation of the through-hole 6b aims at increasing the heat radiation efficiency during magnetic head H1 bonding.

In the embodiment shown in FIG. 1(a), (b), the end face 1a of a through hole 6b formed on a metal board 1 may protrude from the end face of the pattern end, but an embodiment wherein the inner wall surface 1a is aligned with an end face 2a of an insulation layer 2, as shown in FIG. 1, or an inner wall surface 1a of the opening is further retracted from the end face 2a of the insulation layer 2 to a position beneath the insulation layer 2 as shown in FIG. 3(a), (b) is preferable, from the aspect of suppression of a short-circuit between the conductive layer and the metal board.

The amount of retraction of the inner wall surface 1a of the opening from the end face 2a of the insulation layer 2 is preferably about 0 μm-200 μm, particularly preferably 10 μm-100 μm.

Conventionally known techniques may be employed for forming a conductive layer as any circuit pattern on a metal board via an insulation layer, and for forming a through-hole in a metal board.

Figure 2:
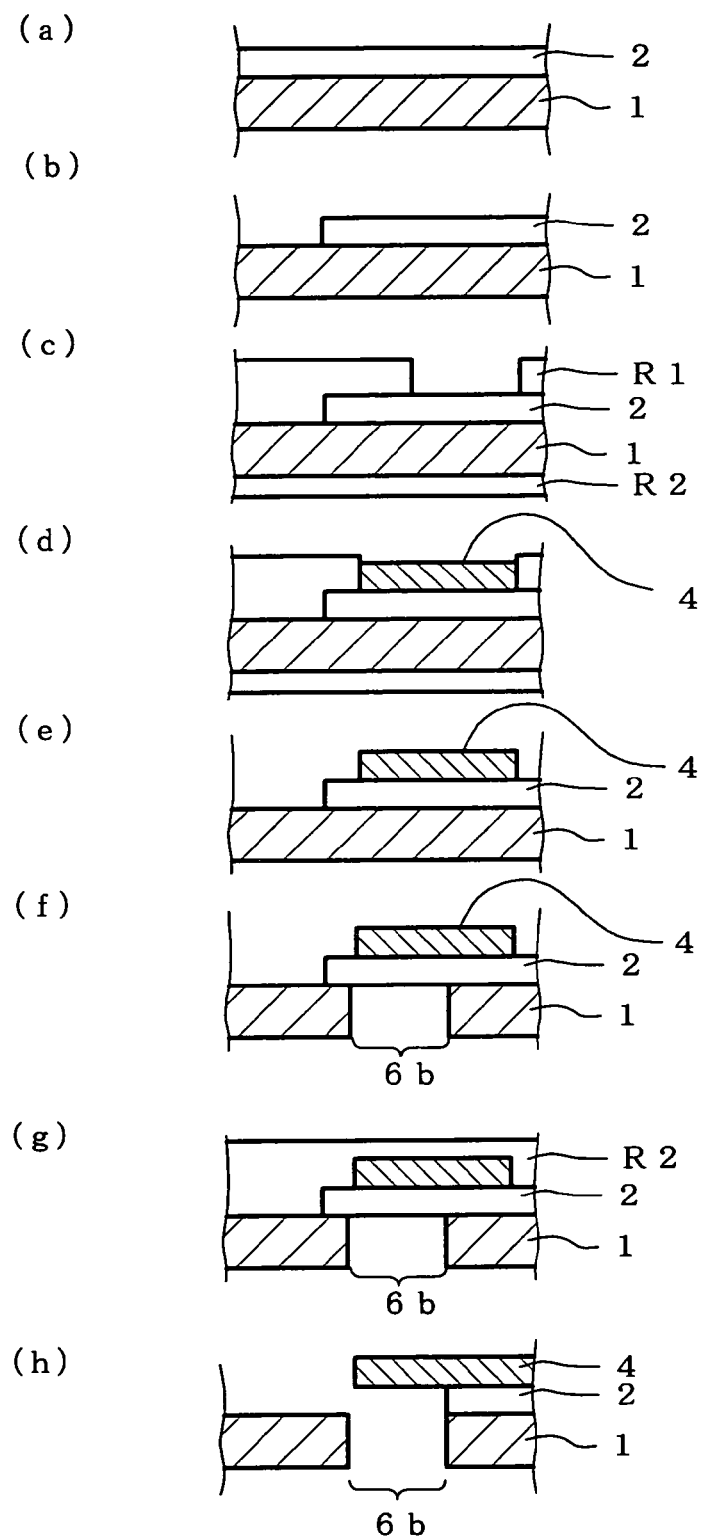
FIGS. 2(a)-(h) are schematic views of the steps for forming a conductive layer on a metal board via an insulation layer made from a photosensitive resin to obtain the pattern end shown in FIG. 1 in the present invention.

FIG. 2 is a schematic view of one embodiment of the steps for obtaining the pattern end shown in FIG. 1(b). In the processing shown in this Figure, an insulation layer 2 is laminated on a metal board 1 as shown in FIG. 2(a), then the insulation layer 2 is processed to give a predetermined pattern as shown in FIG. 2(b). The pattern processing of the insulation layer 2 includes etching using a resist (not shown), patterning by development in the case of a photosensitive resin and the like. Moreover, a resist R1 for electroplating is applied to the both sides as shown in FIG. 2(c), a conductive layer 4 is formed by electroplating on an exposed area free of resist R1 as shown in FIG. 2(d), and the resist R1 is completely removed as shown in FIG. 2(e). Furthermore, an opening 6b1 is formed from the back of the metal board 1 as shown in FIG. 2(f) (application of resist for etching to give the opening etc. are not shown), the entire upper surface is covered with a resist R2 for insulation layer as shown in FIG. 2(g), insulation layer 2 is removed by etching from the opening 6b1 side and the resist R2 is removed to give the object pattern end as shown in FIG. 2(h).

In the above-mentioned steps, various improvements may be made; for example, to form a conductive layer on an insulation layer by electroplating, a two-layer base layer comprising a Cr layer as a lower layer and a Cu layer as an upper layer may be deposited on the insulation layer by sputtering and the like.

A preferable example of the structure of a pattern end is shown in the following.

Figure 4:
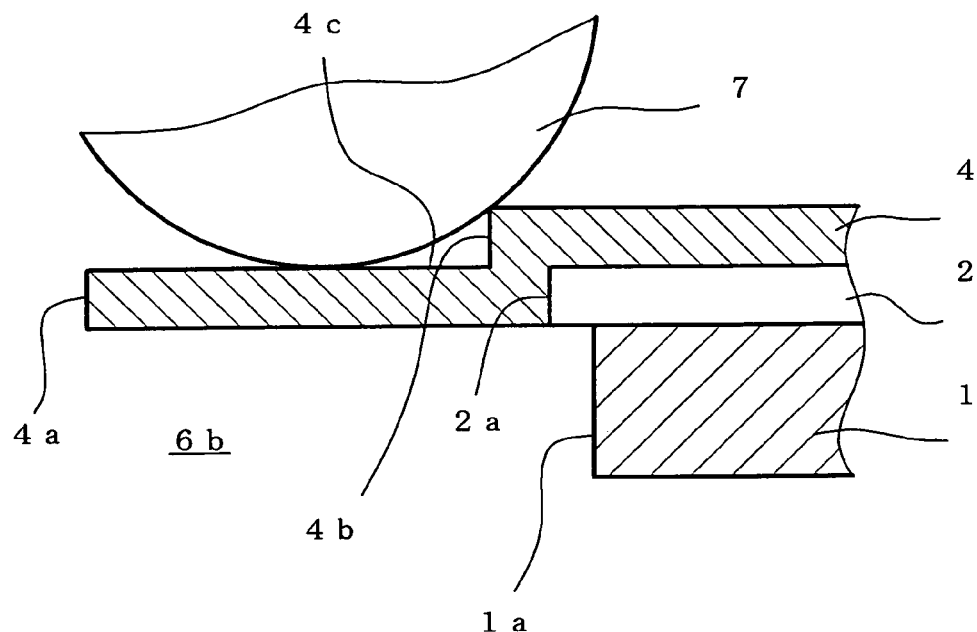
FIGS. 4(a)-(b) are schematic views of a preferable embodiment of the present invention.
Figure 4:
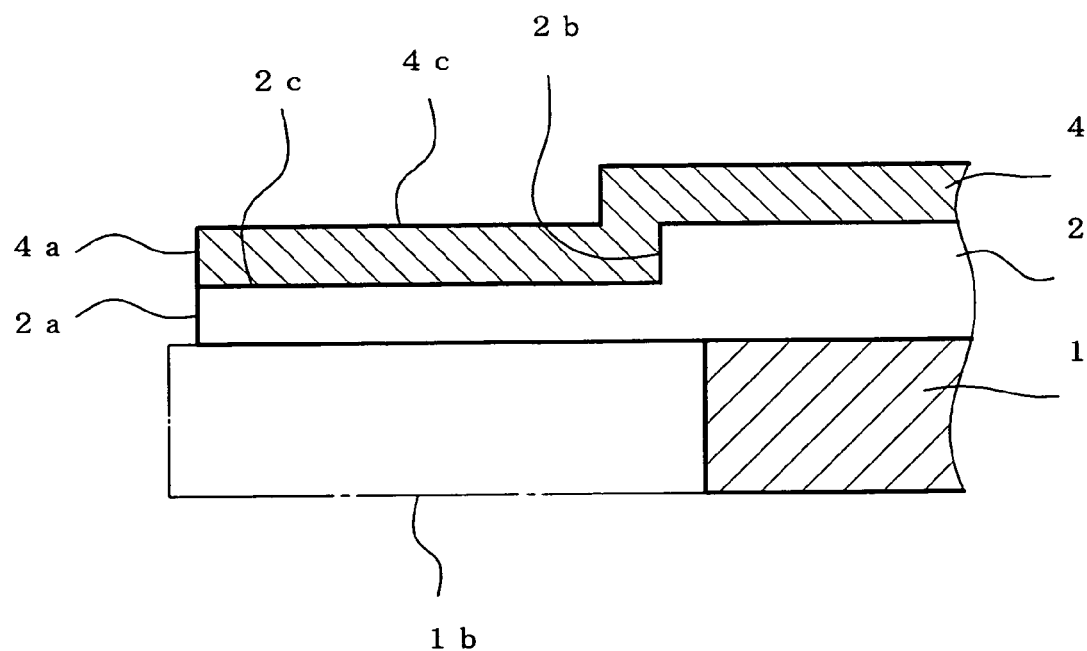

FIG. 4 shows an embodiment having a stepped-part on the upper surface of a conductive layer. With the stepped-part, movement of a solder ball to an unintended position is suppressed and deviation of laser irradiation from the solder ball is also reduced.

In the embodiment of FIG. 4(a), a pattern end 4 protrudes from an end face 2a of an insulation layer 2 directly beneath it in the terminating direction (direction to the left side of the Figure), bends toward the lower layer side along the end face 2a of the insulation layer 2 and then bends in the terminating direction and protrudes as a cantilever terminal on the through-hole. By these two bendings, a stepped-part having a lower level surface 4c on the tip side is formed on the upper surface of the pattern end (4b being the plane heading downward at the stepped-part).

Such stepped-part structure has a sufficiently thick tip part of the terminal protruding over the through-hole 6b, as compared to a different level structure formed by simply reducing the thickness by etching from the upper surface of the conductive layer. Therefore, the tip part of the terminal has a mechanical strength for a stepped-part structure, and becomes a highly reliable terminal also for a connection using a solder ball.

The process for forming a stepped-part structure in the pattern end shown in FIG. 4(a) is basically the same as the process shown in FIG. 2. That is, an opening area of the resist R1 shown in FIG. 2(c) is spread to partially expose the upper surface of the metal board 1 in the opening, thereby extending the conductive layer in FIG. 2 (d) on a metal board 1, and an opening 6b1 is spread in the metal board 1 as shown in FIG. 2 (f) to make a cantilever-like pattern end.

In the embodiment of FIG. 4(b), a pattern end 4 protrudes as a cantilever on a through-hole 6b, and an insulation layer 2 directly beneath it also protrudes along the lower face thereof. The end face 4a of a pattern end 4 and an end face 2a of an insulation layer 2 are aligned with each other.

The insulation layer 2 has a stepped-part on the upper surface which is one step lower at the tip (2c being the lower level surface). By covering the stepped-part on the insulation layer 2, a stepped-part is also formed on the upper surface of the pattern end 4, and a lower plane 4c is formed.

In this embodiment, since an insulation layer extends along the lower side of the conductive layer, the terminal part protruding like a cantilever has high rigidity, which is a preferable embodiment.

In the embodiment of FIG. 4(b), since an insulation layer extends along the lower side of the conductive layer as shown in this Figure with a dashed line 1b, a metal board can be made to further protrude in the terminating direction of the terminal, thereby affording a preferable embodiment imparting further rigidity to the terminal.

As in the embodiment shown in FIG. 4(b), as a method for forming a stepped-part on the upper surface of the insulation layer, a method comprising gradation exposure of a photosensitive resin as a material of the insulation layer can be mentioned.

The gradation exposure is a technique using a gradation exposure mask to gradually or stepwisely control the irradiation amount of light, whereby stepwise difference is produced in the thickness of insulation layer after curing.

A gradation exposure mask is a mask made of a material that does not permit permeation of light, which has an optional area of a mask layer having a dot-like or stripe-like pattern formed by ultrafine light permeation holes in assembly (in other words, a mask layer is formed to have a mesh pattern, a stripe pattern and the like). By selecting the arrangement pattern of light permitting holes, such as the size of the light permitting holes and density of assembly and the like, the mask can freely change the amount of light irradiated on the photosensitive resin.

To form such a gradation exposure mask, for example, a method comprising vapor deposition of a chrome thin film on a quartz glass board to form a stripe (net) pattern of light permeation parts and light shields and the like can be mentioned. The light transmission of the part free of a chrome thin film (light transmission part) is about 100%, and the light transmission of the part having a chrome thin film (light shield part) is about 0%. By controlling the area ratio of the both, size of light permeation hole, density and the like, a masked area having a stripe (net-like) pattern can have any light transmission of the whole area, and as a result, gradation exposure is enabled.

One embodiment of process for forming a simple stepped-part shown in FIG. 4(b) is as follows. The material of an insulation layer is photosensitive polyimide in one embodiment.

A photosensitive polyamide acid (photosensitive polyimide precursor) liquid is applied on a metal board and dried to give a photosensitive polyamide acid film (layer).

Gradation exposure is performed with a photosensitive polyamide acid film to meet the relationship between the amounts of light to be irradiated of (part to be completely removed; no irradiation)<(part where layer thickness should be reduced)<(layer to be retained as it originally is) using a gradation exposure mask.

After applying the gradation exposure as mentioned above, the film is heated at a temperature of 120-180° C. for about 2-10 minutes, and then developed. As a result, a part that was not irradiated at all (non-exposed part) is completely removed by a developer solution, a part where a weak light was irradiated through the stripe pattern mask remains thin, and a part where a strong light was irradiated without the mask remains as a layer having the original thickness, whereby a stepped-part is formed.

When this is heated (cured by heating), a polyimide insulation layer having a stepped-part can be obtained as shown in FIG. 4(b).

As to the wavelength, light source, developing solution and the like used for exposure of the photosensitive resin, conventionally known techniques can be referred to.

Figure 5:
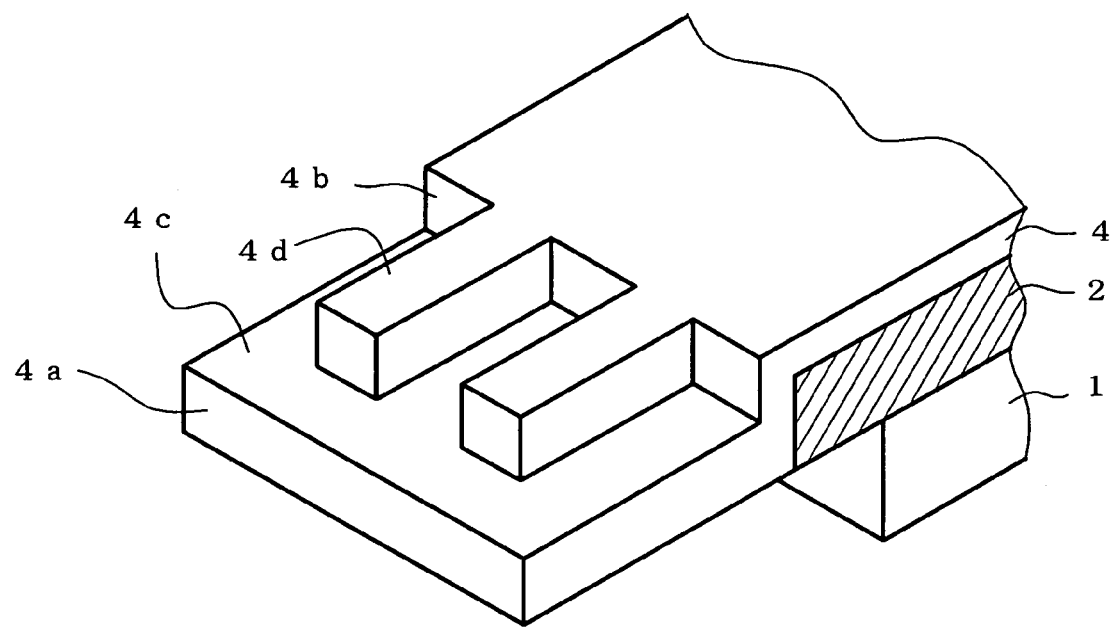
FIG. 5 is a schematic perspective view of another embodiment of the present invention.
Figure 5:
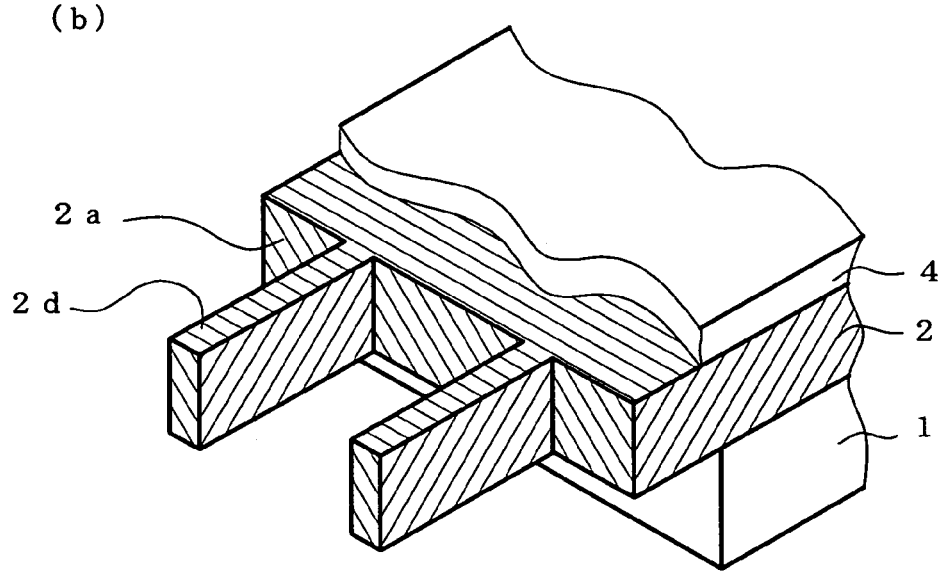
Figure 6:
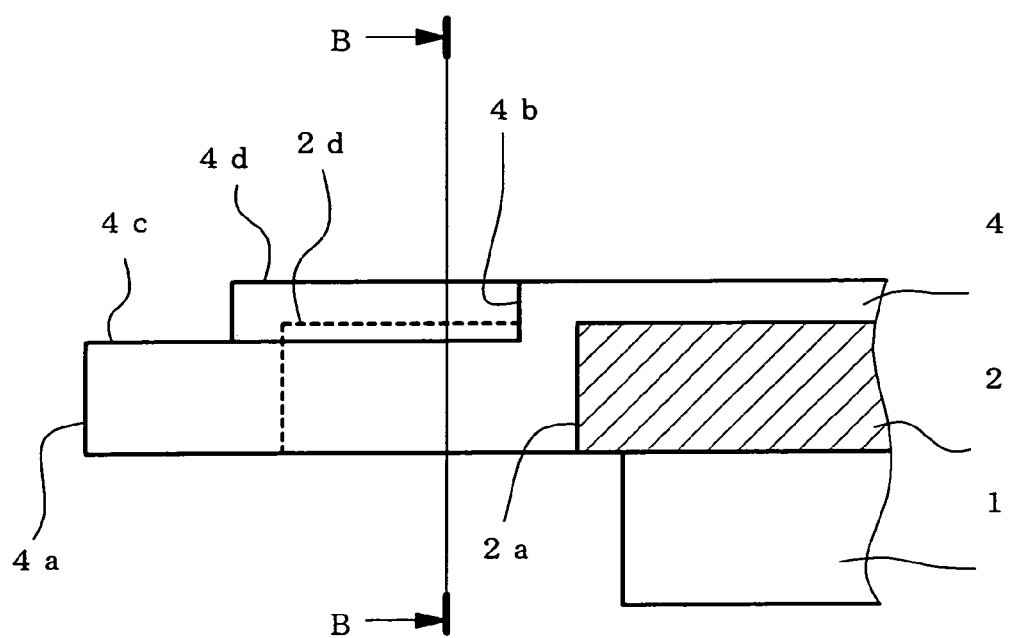
FIG. 6 shows the detail of the structure of the pattern end shown in FIG. 5.
Figure 6:
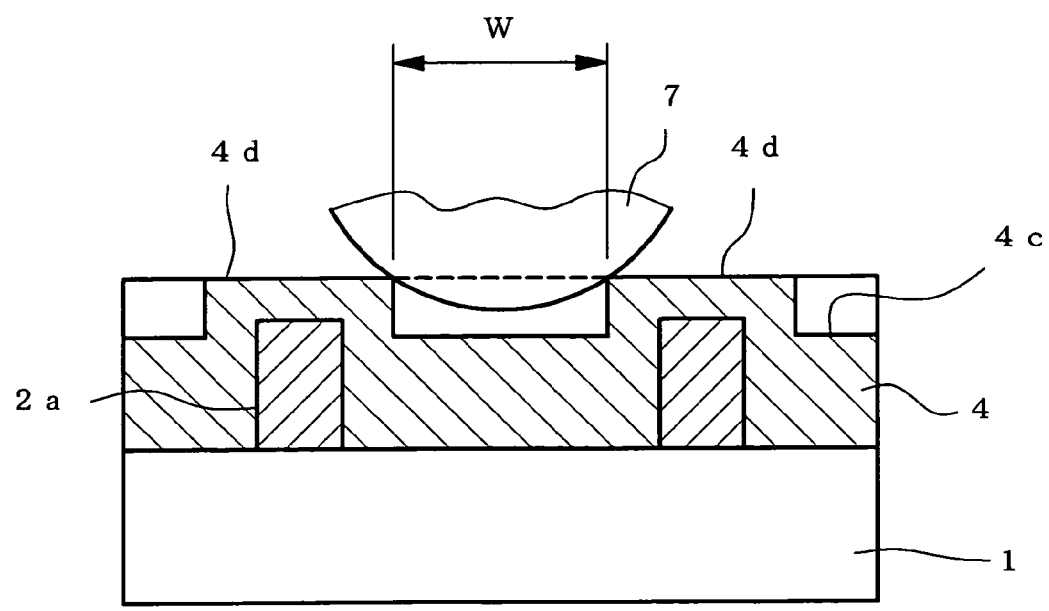

The embodiments shown in FIGS. 5 and 6 include further modifications made to the embodiment of FIG. 4(a).

FIG. 5(a) is a perspective view of the whole appearance near a pattern end in this embodiment, and FIG. 5(b) is a perspective view of the structure of the tip of the insulation layer, breaking away the tip of the pattern end for explanation.

In this embodiment, two protrusion parts 2d are formed, which extend in the terminating direction from the end face 2a of the insulation layer 2 directly beneath the pattern end 4, as shown in FIG. 5(b).

The tip of the pattern end 4 protrudes in the terminating direction from an end face 2a of the insulation layer 2, bends toward the lower layer side covering the end face 2a of the insulation layer 2, and further bends in the terminating direction, thus providing a terminal protruding as a cantilever, as shown in FIG. 6(a).

By these bendings, a stepped-part having a lower level surface 4c on the tip side (4b heading lower from the stepped-part) is formed on the upper surface of the pattern end 4. This aspect is the same as in the step structure of FIG. 4(a).

The difference between the embodiments shown in FIGS. 5 and 6 and the embodiment of FIG. 4(a) is that, as shown in FIG. 5(a) and FIG. 6(b), due to the concave-convex of the protrusion part 2d of the insulation layer 2, two ridge-shaped protrusion parts 4d are also formed on the lower stepped-part 4c on the tip side of the pattern end 4.

It is difficult to form such ultrafine ridge-shaped metal protrusions from the upper surface of the conductive layer by cutting, etching and the like. A method comprising forming two lines of protrusion parts on an insulation layer and covering the concave-convex of the protrusion parts, thereby also forming two ridge-shaped protrusion parts on the pattern end like the above process, is useful for forming concave-convex of a desired pattern on a metal terminal surface or an electrode surface.

Since the pattern end has two ridge-shaped protrusion parts 4d, a solder ball 7 partly drops into the groove between the ridge-shaped protrusion parts 4d and stabilized, as shown in FIG. 6(b). Along with the stabilization of the solder ball in the fixed position, deviation of laser beam irradiation is also suppressed.

The embodiment of FIG. 7(a) shows the embodiment of FIG. 4 with similar modifications made to the embodiments of FIGS. 5 and 6.

In the embodiment shown in FIG. 7(a), a pattern end 4 protrudes as a cantilever as in the embodiment of FIG. 4(b), and an insulation layer 2 also protrudes directly beneath it along the lower level surface thereof. An end face 4a of the pattern end 4 and an end face 2a of the insulation layer 2 are aligned with each other.

As shown in FIG. 7(b), the insulation layer 2 has a low tip so that a stepped-part can be made in the level of the upper surface, and as a result of the stepped-part on the upper surface of the insulation layer, a stepped-part is also formed on the upper surface of the pattern end. Furthermore, in the stepped-part on the upper surface of the insulation layer 2, two ridge-shaped protrusion parts 2d extending in the terminating direction from the stepped-parts are formed on the lower level surface 2c of the tip side.

Due to the ridge-shaped protrusion parts 2d, two ridge-shaped protrusion parts ~4d of the stepped-part on the pattern end are formed on the lower level surface 4c of the tip side.

Figure 7:
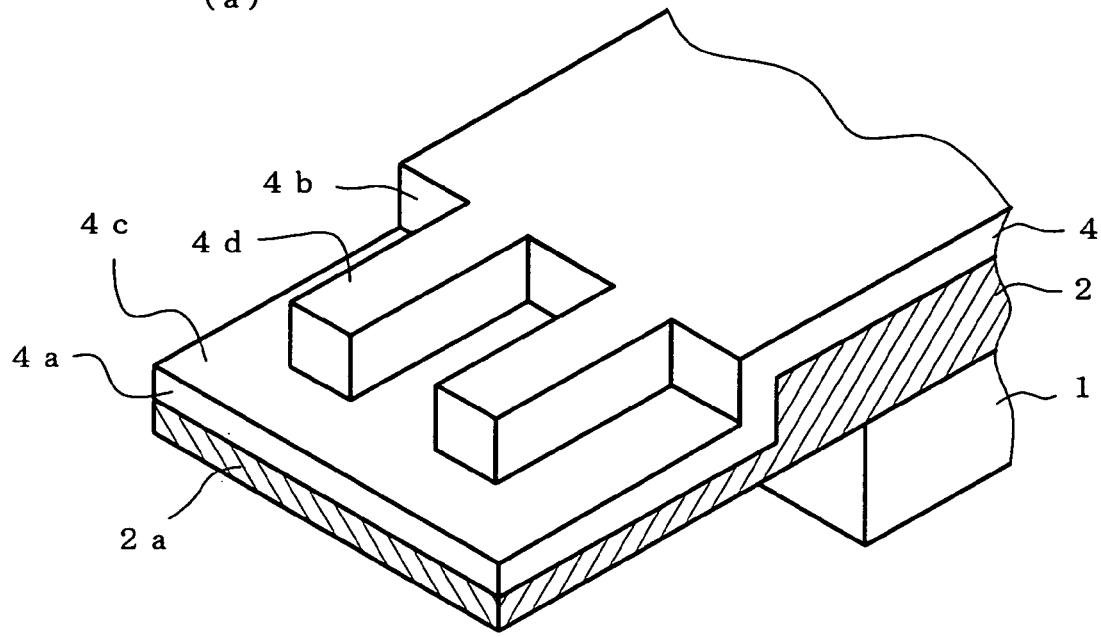
FIG. 7 is a schematic perspective view of another embodiment of the present invention.
Figure 7:
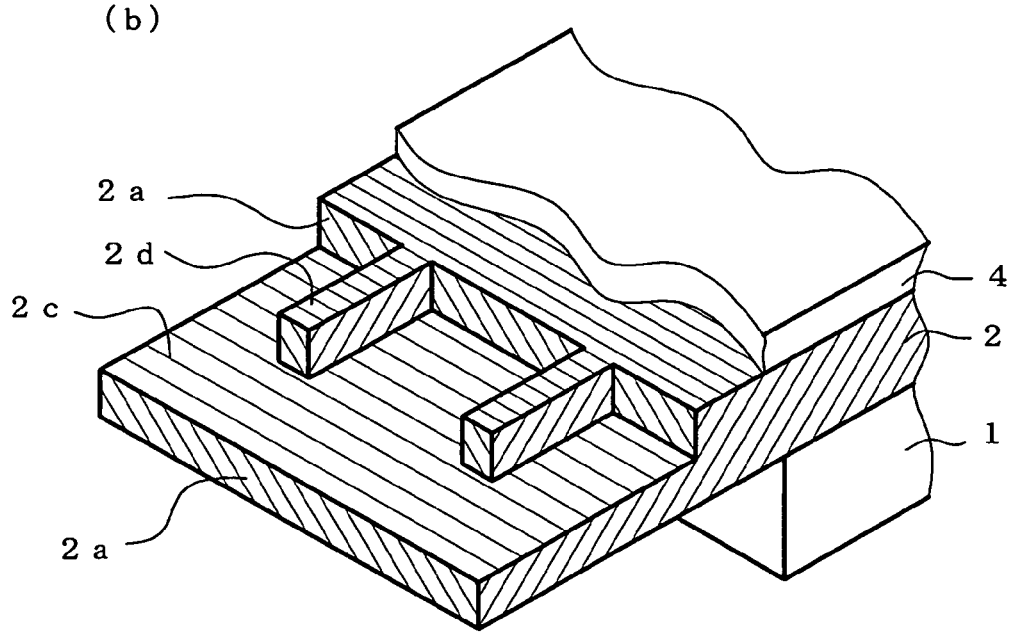
Figure 8:
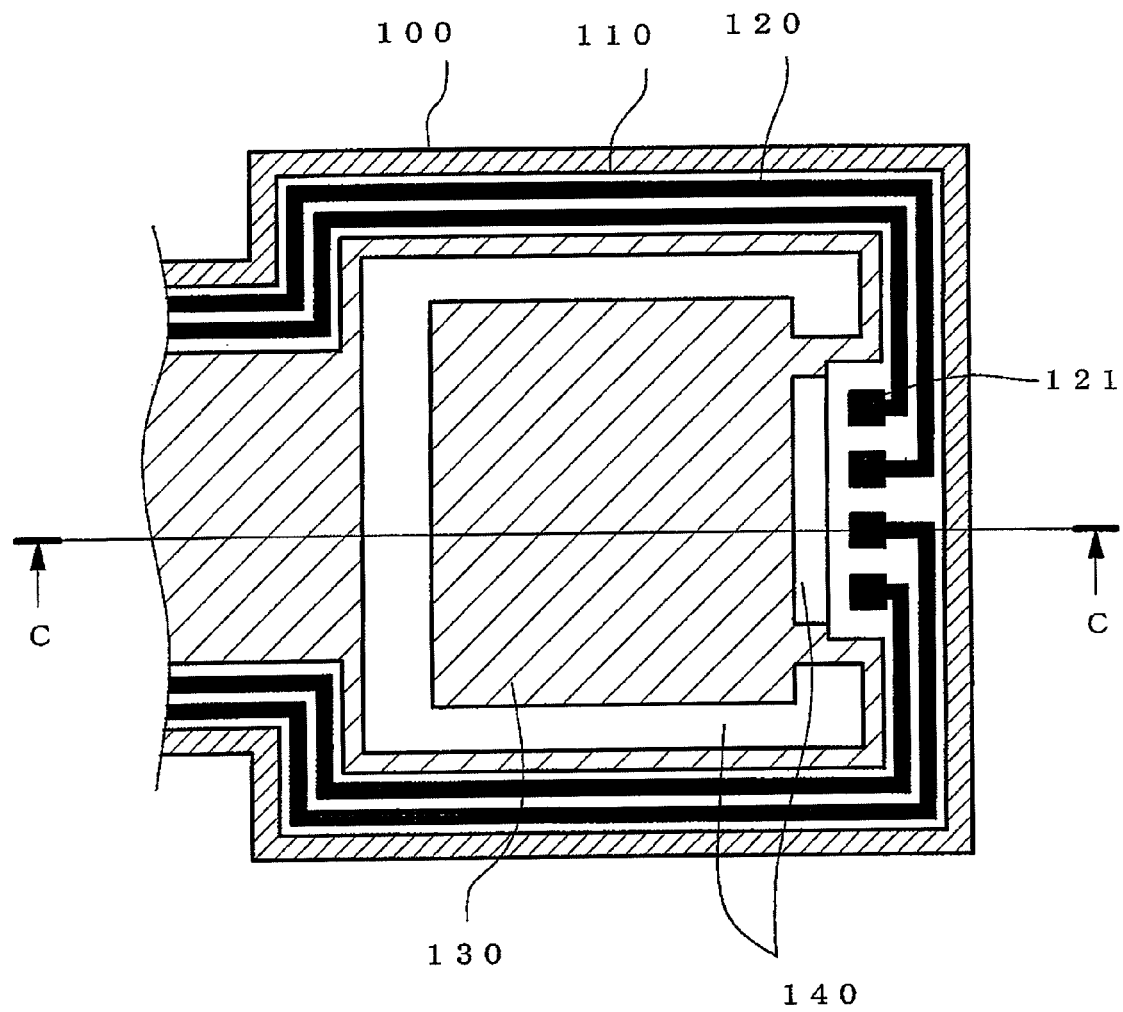
FIG. 8 is a schematic view of a conventional suspension board with a circuit wherein only the tip is enlarged, and hatching is applied to the board and a different hatching for clarifying the area of insulation layer is applied to clearly show a through-hole (space) formed on the board.
Figure 9:
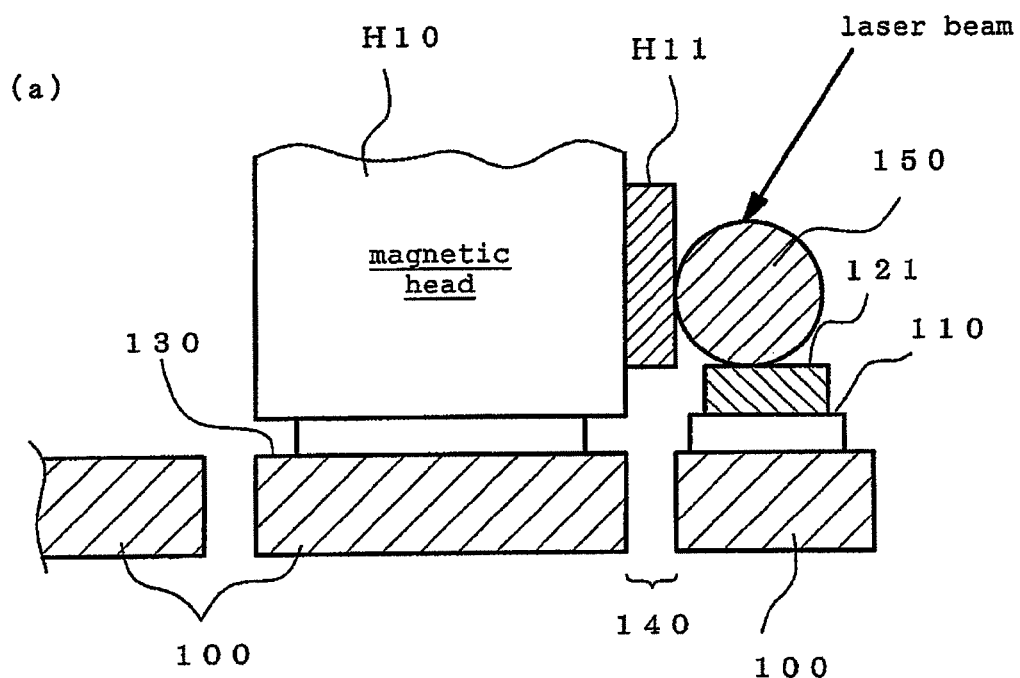
FIG. 9 is a partial sectional view (end view) showing a section C-C of the suspension board with a circuit of FIG. 8 with a magnetic head, wherein the tip side is further enlarged.
Figure 9:
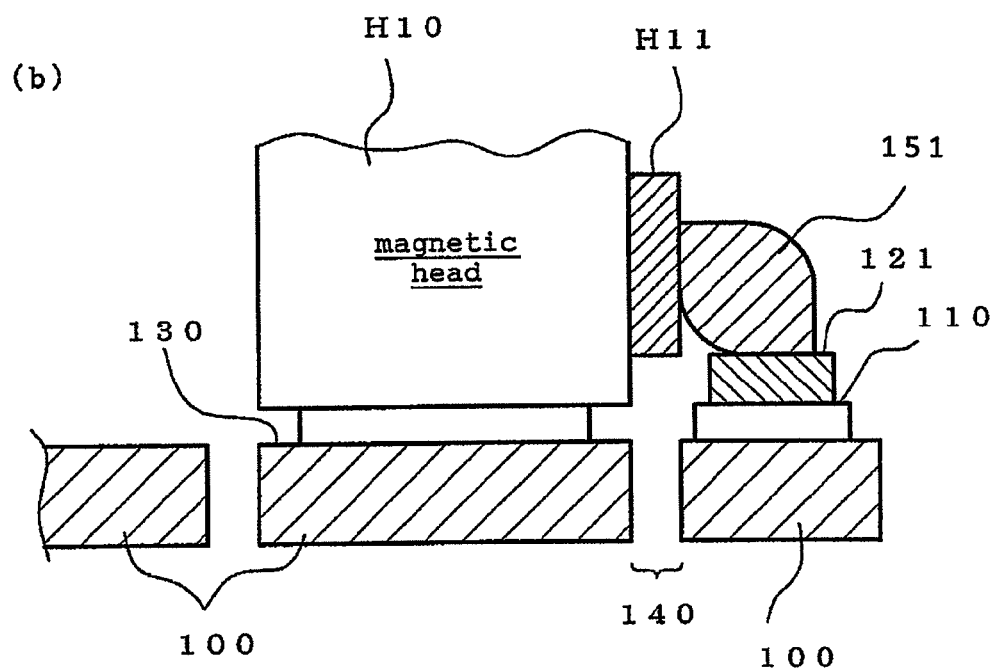

The embodiment of FIG. 7 is preferable because, as in FIG. 4(b), an insulation layer extends along the lower side of the conductive layer, thus imparting high rigidity to the end. Moreover, since an insulation layer extends along the lower side of the conductive layer, a preferable embodiment can be achieved wherein a metal board 1 is further protruded in the terminating direction of the terminal to impart further rigidity to the terminal, as in FIG. 4(b).

As shown in FIG. 7(b), two ridge-shaped protrusion parts 2d can be further formed on the lower level surface 2c on the tip side of the insulation layer 2 by applying the above-mentioned gradation exposure to form a stepped-part including the two ridge-shaped protrusion parts 2d on the tip of the insulation layer 2.

In the embodiments of FIG. 5 and FIG. 7, the width of the gap between the two ridge-shaped protrusion parts 4d (size represented by W in FIG. 6(b)) may be any as long as it can limit the movement of a solder ball, and can be appropriately determined according to the diameter of the solder ball used.

The width W is preferably 20%-60%, particularly 30%-50%, of the diameter of the solder ball.

The length and width of each of the two ridge-shaped protrusion parts 4d in the embodiments of FIG. 5 and FIG. 7 can be appropriately determined according to the diameter of the solder ball.

For a solder ball having a diameter of about 80 μm-120 μm widely used at present, the length of the ridge-shaped protrusion part 4d is preferably 30 μm-100 μm, particularly 40 μm-70 μm, and the width is preferably about 10 μm-50 μm, particularly 15 μm-30 μm.

While the two ridge-shaped protrusion parts are parallel to each other in the embodiments of FIG. 5 and FIG. 7, they may form various patterns for easy receipt of a solder ball, such as a pattern that increasingly opens toward the tip, a pattern curved to surround a solder ball from the both sides, a branched pattern and the like.

The "two ridge-shaped protrusion parts" in the context of the present invention do not limit the number of the ridge-shaped protrusion parts to two alone, but mean that at least two main ridge-shaped protrusion parts are involved to support a solder ball. A third and a fourth ridge-shaped protrusion parts may be present as appropriate to contribute to the keeping of a solder ball, besides the two ridge-shaped protrusion parts.

For example, when two solder balls are used for one solder connection part, three ridge-shaped protrusion parts provide two grooves between them and each groove can hold a solder ball. Such a variant embodiment comprising three ridge-shaped protrusion parts is equivalent to an embodiment comprising two sets of two ridge-shaped protrusion parts supporting solder balls.

In the embodiments of FIG. 4-FIG. 7, simplified shapes having a right angle and parallel positions for respective parts are shown for the sake of explanation. In addition, a multi-phase structure may be employed utilizing a gradation exposure technique.

As described above, in the present invention, an end face of an insulation layer directly beneath the pattern end does not go beyond the end face of the pattern end. Therefore, even if a laser beam is irradiated near the terminal portion of the pattern end, direct irradiation on the insulation layer is suppressed, and the development of a thermally decomposed product is suppressed.

Moreover, as a preferable terminal structure in the present invention, various stepped-parts have been provided to stabilize a solder ball in the placing position on the surface of a pattern end. This structure facilitates a laser beam hitting the solder ball.

This application is based on a patent application No. 2004-309774 filed in Japan, the contents of which are hereby incorporated by reference.

What is claimed is:

1. A suspension board with a circuit, which comprises a metal board comprising an area for mounting a magnetic head, and other area comprising a conductive layer provided on the metal board as a circuit pattern via an insulation layer,
   the aforementioned circuit pattern having a pattern end to be a terminal to be connected with a terminal of a magnetic head, and
   the end face of the pattern end is aligned with the end face of the insulation layer directly beneath, or protruding from the end face of the insulation layer in the terminating direction,
   wherein the metal board has an opening penetrating the board on the terminating side of the pattern end and an inner wall surface of the opening is retracted to a position beneath the insulation layer, and
   wherein the pattern end protrudes in the terminating direction from the end face of an insulation layer directly beneath it, then bends toward the lower layer side, covering the end face of the insulation layer, and further bends in the terminating direction, whereby a stepped-part is made on the upper surface of the pattern end, with a lower level on the tip side.

2. The suspension board with a circuit of claim 1, wherein the metal board is a stainless flat spring having a thickness of 10-70 μm.

3. The suspension board with a circuit of claim 1, wherein the magnetic head is a magnetic head of a hard disc drive.

4. The suspension board with a circuit of claim 1, wherein the amount of protrusion of the end face of the pattern end relative to the end face of the insulation layer is 0 μm-100 μm.

5. A suspension board with a circuit 4, which comprises a metal board comprising an area for mounting a magnetic head, and other area comprising a conductive layer provided on the metal board as a circuit pattern via an insulation layer,
the aforementioned circuit pattern having a pattern end to be a terminal to be connected with a terminal of a magnetic head, and
the end face of the pattern end is aligned with the end face of the insulation layer directly beneath, or protruding from the end face of the insulation layer in the terminating direction,
wherein the metal board has an opening penetrating the board on the terminating side of the pattern end and an inner wall surface of the opening is retracted to a position beneath the insulation layer,
wherein the pattern end protrudes in the terminating direction from the end face of an insulation layer directly beneath it, then bends toward the lower layer side, covering the end face of the insulation layer, and further bends in the terminating direction, whereby a stepped-part is made on the upper surface of the pattern end, with a lower level on the tip side, and
wherein the insulation layer directly beneath the pattern end comprises at least two protrusion parts protruding from an end surface in the terminating direction, and by covering the protrusions, two ridge-shaped protrusion parts are also formed on the lower level surface on the tip side of the stepped-part of the pattern ends.

6. The suspension board with a circuit of claim 5, wherein the solder to connect a terminal of a magnetic head to be mounted and a pattern end is supplied as a solder ball and two ridge-shaped protrusion parts are so formed to receive and keep the solder ball in a groove between them.

7. The suspension board with a circuit of claim 5, wherein the metal board is a stainless flat spring having a thickness of 10-70 μm.

8. The suspension board with a circuit of claim 5, wherein the magnetic head is a magnetic head of a hard disc drive.

9. The suspension board with a circuit of claim 5, wherein the amount of protrusion of the end face of the pattern end relative to the end face of the insulation layer is 0 μm-100 μm.

10. A suspension board with a circuit, which comprises a metal board comprising an area for mounting a magnetic head, and other area comprising a conductive layer provided on the metal board as a circuit pattern via an insulation layer,
the aforementioned circuit pattern having a pattern end to be a terminal to be connected with a terminal of a magnetic head, and
the end face of the pattern end is aligned with the end face of the insulation layer directly beneath, or protruding from the end face of the insulation layer in the terminating direction,
wherein the metal board has an opening penetrating the board on the terminating side of the pattern end and an inner wall surface of the opening is retracted to a position beneath the insulation layer,
wherein the pattern end has an end face aligned with that of an insulation layer directly beneath it, and the insulation layer has a stepped-part made on the upper surface of the pattern end, with a lower level surface on the tip side, and by covering the stepped-part of the upper surface of the insulation layer, a stepped-part is also formed on the upper surface of the pattern end.

11. The suspension board with a circuit of claim 10, wherein the material of the insulation layer is a photosensitive resin and the stepped-part and/or a ridge-shaped protrusion part of the upper surface of the insulation layer is formed by changing the amount of irradiation of light on the photosensitive resin.

12. The suspension board with a circuit of claim 10, wherein the metal board is a stainless flat spring having a thickness of 10-70 μm.

13. The suspension board with a circuit of claim 10, wherein the magnetic head is a magnetic head of a hard disc drive.

14. A suspension board with a circuit,
which comprises a metal board comprising an area for mounting a magnetic head, and other area comprising a conductive layer provided on the metal board as a circuit pattern via an insulation layer,
the aforementioned circuit pattern having a pattern end to be a terminal to be connected with a terminal of a magnetic head, and
the end face of the pattern end is aligned with the end face of the insulation layer directly beneath, or protruding from the end face of the insulation layer in the terminating direction,
wherein the metal board has an opening penetrating the board on the terminating side of the pattern end and an inner wall surface of the opening is retracted to a position beneath the insulation layer,
wherein the pattern end has an end face aligned with that of an insulation layer directly beneath it, and the insulation layer has a stepped-part made on the upper surface of the pattern end, with a lower level surface on the tip side, and by covering the stepped-part of the upper surface of the insulation layer, a stepped-part is also formed on the upper surface of the pattern end, and
wherein, of the upper surfaces of the stepped-part of the insulation layer directly beneath the pattern end, at least two ridge-shaped protrusion parts are formed, on the lower level surface on the tip side, in the terminating direction from the stepped-part, and by covering the ridge-shaped protrusion parts, two ridge-shaped protrusion parts are also formed on the lower level surface on the tip side, out of the pattern end having the stepped-part.

15. The suspension board with a circuit of claim 14, wherein the material of the insulation layer is a photosensitive resin and the stepped-part and/or a ridge-shaped protrusion part of the upper surface of the insulation layer is formed by changing the amount of irradiation of light on the photosensitive resin.

16. The suspension board with a circuit of claim 14, wherein the metal board is a stainless flat spring having a thickness of 10-70 μm.

17. The suspension board with a circuit of claim 14, wherein the magnetic head is a magnetic head of a hard disc drive.

18. The suspension board with a circuit of claim 14, wherein the solder to connect a terminal of a magnetic head to be mounted and a pattern end is supplied as a solder ball and two ridge-shaped protrusion parts are so formed to receive and keep the solder ball in a groove between them.

* * * * *

UNITED STATES PATENT AND TRADEMARK OFFICE
CERTIFICATE OF CORRECTION

PATENT NO. : 7,525,764 B2  
APPLICATION NO. : 11/256800  
DATED : April 28, 2009  
INVENTOR(S) : Ohsawa et al.

Page 1 of 1

It is certified that error appears in the above-identified patent and that said Letters Patent is hereby corrected as shown below:

<u>IN THE CLAIMS</u>

In claim 5, column 11, line 9, "4" should be deleted:

Signed and Sealed this

Twenty-second Day of December, 2009

David J. Kappos  
*Director of the United States Patent and Trademark Office*